US008610355B2

(12) United States Patent
Terazawa et al.

(10) Patent No.: US 8,610,355 B2
(45) Date of Patent: Dec. 17, 2013

(54) REACTOR STRUCTURE AND PLASMA TREATMENT APPARATUS

(75) Inventors: Tatsuya Terazawa, Kasugai (JP); Wataru Shionoya, Okazaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 13/588,212

(22) Filed: Aug. 17, 2012

(65) Prior Publication Data

US 2012/0306369 A1 Dec. 6, 2012

Related U.S. Application Data

(63) Continuation of application No. PCT/JP2012/051337, filed on Jan. 23, 2012.

(30) Foreign Application Priority Data

Mar. 9, 2011 (JP) ................................. 2011-051338

(51) Int. Cl.
*H01J 7/24* (2006.01)
*H05B 31/26* (2006.01)

(52) U.S. Cl.
USPC ............ 315/111.21; 315/111.01; 315/111.41; 315/111.31; 118/723 R; 118/723 E

(58) Field of Classification Search
USPC ............. 315/111.21, 111.11, 111.01, 111.31, 315/111.41
See application file for complete search history.

(56) References Cited

U.S. PATENT DOCUMENTS

| | | | | |
|---|---|---|---|---|
| 5,733,511 | A * | 3/1998 | De Francesco | 422/186.05 |
| 6,155,199 | A * | 12/2000 | Chen et al. | 118/723 I |
| 6,524,432 | B1 * | 2/2003 | Collins et al. | 156/345.48 |
| 7,810,449 | B2 * | 10/2010 | Brcka et al. | 118/723 I |
| 7,952,048 | B2 * | 5/2011 | Choi et al. | 219/121.57 |
| 8,070,911 | B2 * | 12/2011 | Himori et al. | 156/345.44 |
| 8,367,966 | B2 * | 2/2013 | Takahashi et al. | 219/121.52 |
| 2011/0135542 | A1 | 6/2011 | Shimizu et al. | |

FOREIGN PATENT DOCUMENTS

| | | |
|---|---|---|
| JP | 06-10652 | 1/1994 |
| JP | 2000-031073 | 1/2000 |
| JP | 2010-182553 | 8/2010 |
| JP | 2010-183393 | 8/2010 |
| JP | 2012-069448 | 4/2012 |
| WO | 2010/018783 A1 | 2/2010 |

OTHER PUBLICATIONS

International Search Report, International Application No. PCT/JP2012/051337, dated Apr. 24, 2012 (2 pages).

* cited by examiner

*Primary Examiner* — Daniel Cavallari
*Assistant Examiner* — Srinivas Sathiraju
(74) *Attorney, Agent, or Firm* — Burr & Brown, PLLC

(57) ABSTRACT

A distance from a negative output terminal of a secondary winding of the transformer to a feeding terminal of the cathode plate is longer than a distance from a positive output terminal of the secondary winding to a feeding terminal of the anode. The anode side feeding path electrically connects the feeding terminal of the anode bar to the positive output terminal of the secondary winding. The cathode side feeding path electrically connects the feeding terminal of the cathode plate to the negative output terminal of the secondary winding. A path length of the cathode side feeding path is longer than a path length of the anode side feeding path. The housing is formed by an electric conductor and is electrically connected to the cathode side feeding path.

2 Claims, 6 Drawing Sheets

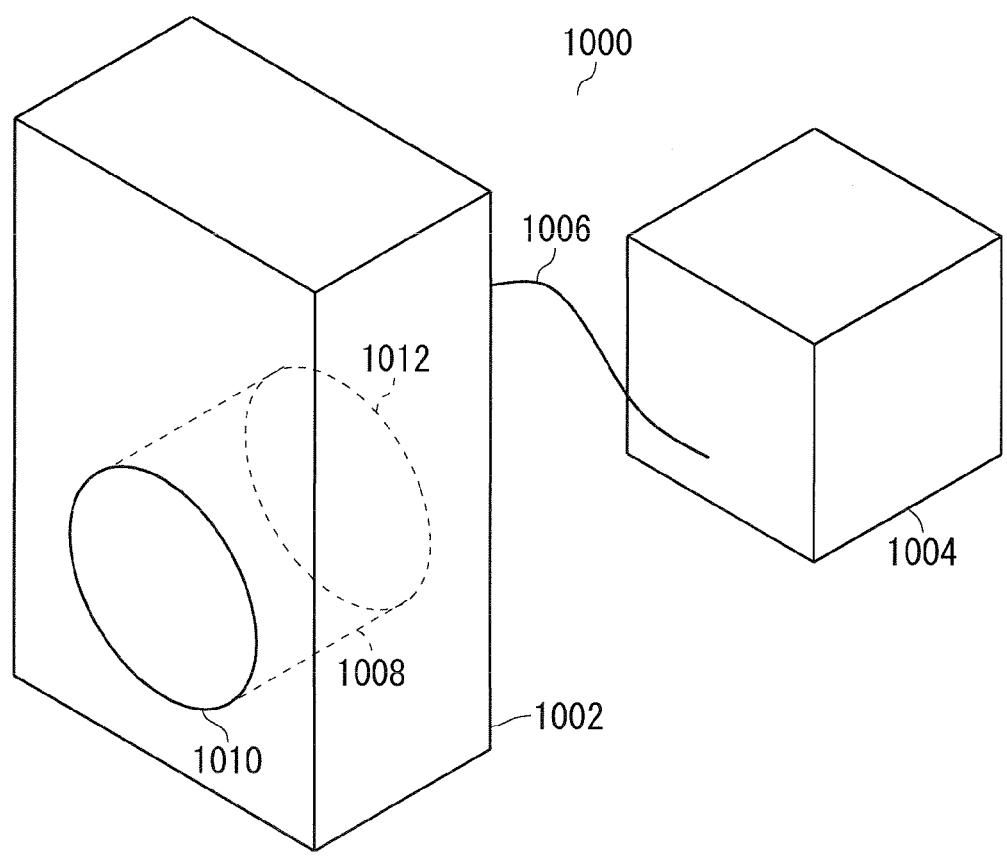
F I G . 1

REACTOR STRUCTURE AND PLASMA TREATMENT APPARATUS

BACKGROUND OF THE INVENTION

1. Field of the Invention

The present invention relates to a reactor structure and a plasma treatment apparatus.

2. Background Art

In the plasma treatment apparatus of Patent Document 1, an anode and a cathode are provided in a passage formed in a structure. The anode and the cathode are electrically connected to a first output terminal and a second output terminal of a secondary winding of a transformer, respectively. A pulse voltage is applied between the anode and the cathode, a discharge is generated in a section from the anode to the cathode, and a plasma is generated in the passage so that a gas flowing in the passage is activated by the plasma.

PRIOR ART DOCUMENT

Patent Document

Patent Document 1: International Publication No. WO 2010/018783

SUMMARY OF INVENTION

A high pulse voltage is applied to a reactor of a plasma treatment apparatus. In order to ensure a safety or to prevent diffusion of noises, accordingly, it is desirable to house constituents of the reactor in a housing constituted by an electric conductor.

In the case in which the constituents of the reactor are housed in the housing constituted by the electric conductor, however, a stray capacitance is generated between an electrode, a feeding path or the like and the housing so that a waveform of a pulse voltage to be applied between the anode and the cathode tends to be disturbed.

The present invention has been made to solve the problem. It is an object of the present invention to provide a reactor structure of a plasma treatment apparatus and the plasma treatment apparatus in which disturbances in a waveform of a pulse voltage are suppressed.

First to third aspects of the present invention are directed to a reactor structure of a plasma treatment apparatus.

(1) In the first aspect of the present invention, a structure, a transformer, a first electrode, a second electrode, a first feeding path, a second feeding path and a housing are provided.

A passage is formed in the structure.

The transformer includes a primary winding and a secondary winding. The secondary winding has a first output terminal and a second output terminal.

The first electrode has a first feeding terminal. The second electrode has a second feeding terminal. A distance from the second output terminal to the second feeding terminal is longer than a distance from the first output terminal to the first feeding terminal.

An extending direction of the first electrode is not parallel with an extending direction of the second electrode. The first electrode and the second electrode cross the passage. The first electrode and the second electrode are separated from each other in the extending direction of the passage.

The first feeding path electrically connects the first feeding terminal and the first output terminal to each other. The second feeding path electrically connects the second feeding terminal and the second output terminal to each other. A path length of the second feeding path is greater than a path length of the first feeding path.

An housing space is formed on the housing. The structure, the transformer, the first electrode, the second electrode, the first feeding path and the second feeding path are accommodated in the housing space. The housing is constituted by an electric conductor and is electrically connected to the second feeding path.

(2) In the second aspect of the present invention, a further matter is added to the first aspect of the present invention. In the second aspect of the present invention, a distance from an internal surface of the housing provided in contact with the housing space to the second feeding terminal is shorter than a distance from the internal surface to the first feeding terminal.

(3) In the third aspect of the present invention, a further matter is added to the first or second aspect of the present invention. In the third aspect of the present invention, at least two first electrodes are arranged in parallel and at least two second electrodes are arranged in parallel. The first feeding path includes a first collector and a first wiring. The first electrode is connected to a first connecting surface of the first collector. The first wiring is connected to the first output terminal and the first collector. The second feeding path includes a second collector and a second wiring. The second electrode is connected to a second connecting surface of the second collector. The second wiring is connected to the second output terminal and the second collector.

A fourth aspect of the present invention is directed to a plasma treatment apparatus in which a circuit is added to the reactor structure according to the first aspect of the present invention.

(4) In the fourth aspect of the present invention, a conduction path, an inductor, a switch circuit and a transmission line are provided in addition to the reactor structure according to the first aspect of the present invention. The primary winding has a first input terminal and a second input terminal.

The conduction path reaches from a first DC input terminal to a second DC input terminal sequentially via a first branch and a second branch.

The inductor is inserted into a section from the first branch to the second branch in the conduction path. The switch circuit is inserted into a portion other than the section of the conduction path. The switch circuit electrically opens/closes the conduction path.

The transmission line includes a first transmission wire and a second transmission wire. The first transmission wire electrically connects the first branch and the first input terminal to each other. The second transmission wire electrically connects the second branch and the second input terminal to each other.

Effect of the Invention

According to the present invention, the second feeding path which is relatively long and the housing have an equal electric potential and the influence of a stray capacitance is decreased so that disturbances in the waveform of the pulse voltage to be applied between the first electrode and the second electrode are suppressed.

According to the second aspect of the present invention, the stray capacitance between the first feeding path and the housing is decreased so that disturbances in the waveform of the pulse voltage to be applied between the first electrode and the second electrode are suppressed.

According to the third aspect of the present invention, a region in which a plasma is generated is enlarged so that a gas is efficiently activated.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a perspective view showing a desirable embodiment of a plasma treatment apparatus.

DETAILED DESCRIPTION OF THE INVENTION (Summary of Plasma Treatment Apparatus)

A schematic diagram of FIG. 1 is a perspective view showing a desirable embodiment of a plasma treatment apparatus.

As shown in FIG. 1, a plasma treatment apparatus 1000 includes a reactor 1002, a pulse generator body 1004 and a coaxial cable 1006. A passage 1008 is provided in the reactor 1002. An inlet 1010 and an outlet 1012 are formed on a surface of the reactor 1002. The passage 1008 is extended from the inlet 1010 toward the outlet 1012.

When the pulse generator body 1004 generates a pulse voltage in a state in which a gas flows from the inlet 1010 to the outlet 1012 via the passage 1008, the pulse voltage is transmitted from the pulse generator body 1004 to the reactor 1002 by means of the coaxial cable 1006 so that a discharge is generated in the passage 1008. When the discharge is generated in the passage 1008, a plasma is generated in the passage 1008 so that a gas flowing in the passage 1008 is activated by the plasma. The activation of the gas is a treatment for enhancing a reactivity of a gas, for example, an excitation of chemical species to a higher energy level, a generation of an ion, a generation of a radical or the like. The discharge generated in the passage 1008 is desirably a streamer discharge.

(Summary of Structure of Reactor)

Figure 2:
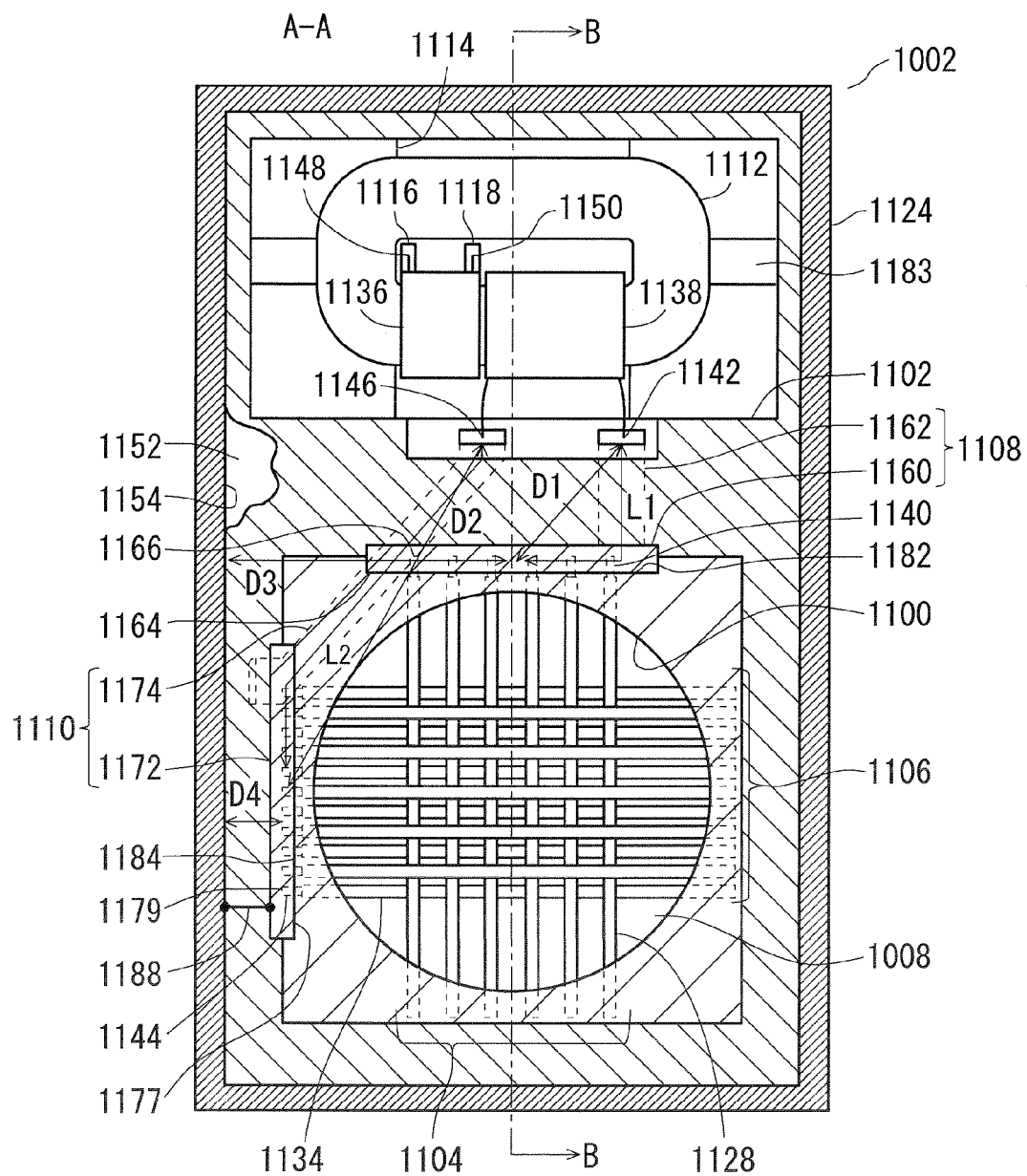
FIG. 2 is a sectional view showing a reactor.
Figure 3:
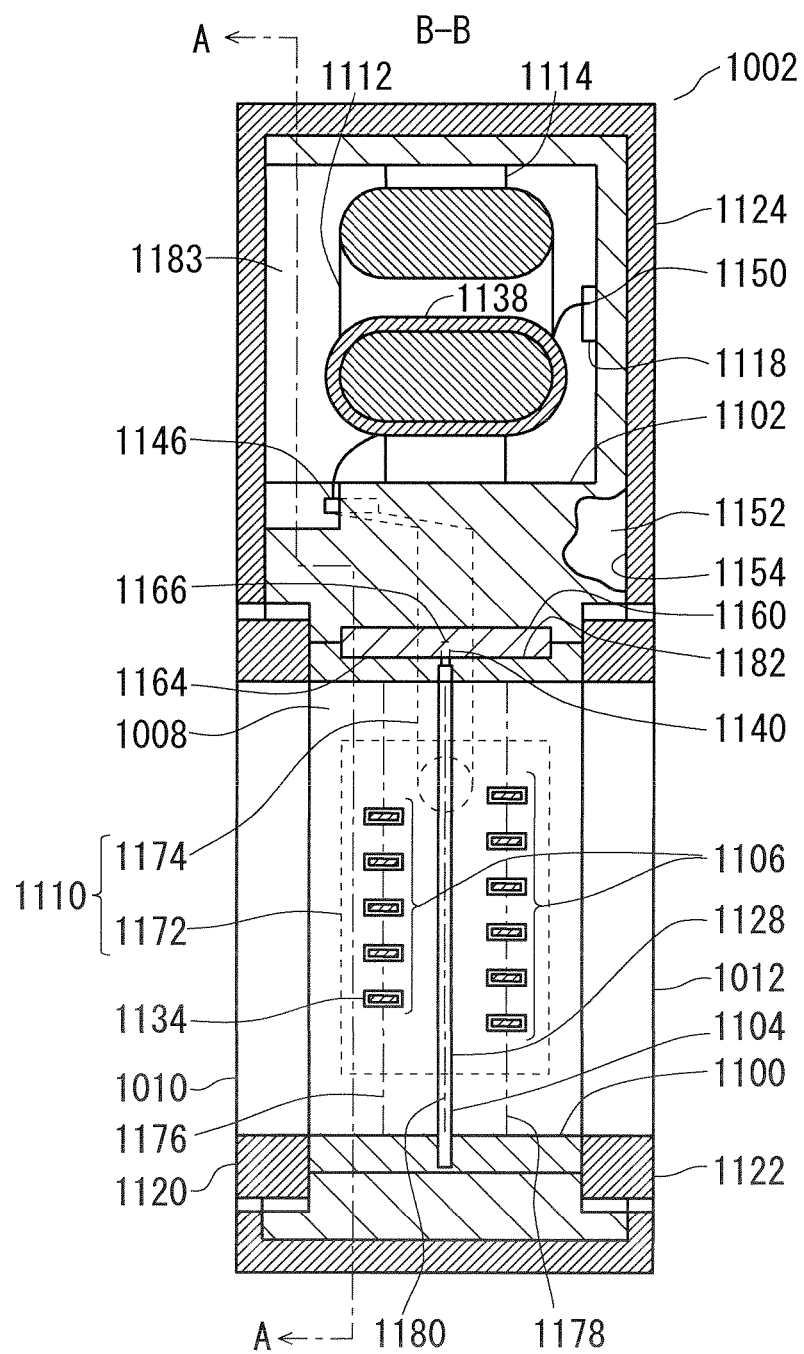
FIG. 3 is a sectional view showing the reactor.

Schematic diagrams of FIGS. 2 and 3 show sections of a reactor. A schematic diagram of FIG. 4 is a perspective view showing an anode and a cathode.

Figure 4:
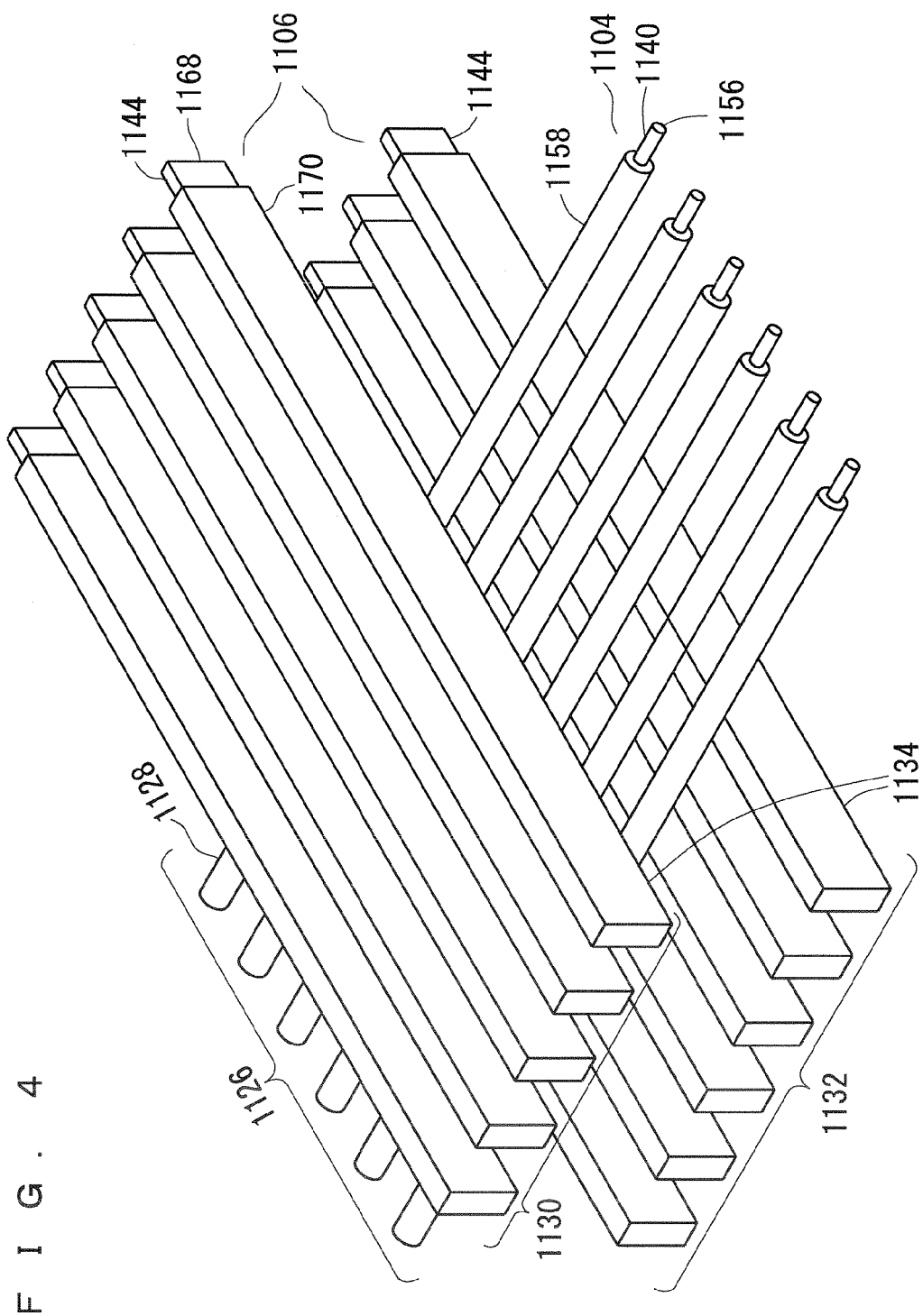
FIG. 4 is a perspective view showing an anode and a cathode.

As shown in FIGS. 2 to 4, the reactor 1002 includes a passage formation 1100, a transformer chamber formation 1102, an anode 1104, a cathode 1106, an anode side feeding path 1108, a cathode side feeding path 1110, a transformer 1112, a transformer holding member 1114, a positive electrode connecting terminal 1116, a negative electrode connecting terminal 1118, an intake pipe mounting seat 1120, an exhaust pipe mounting seat 1122, and a housing 1124.

The anode 1104 includes an anode bar array 1126. In the anode bar array 1126, an anode bar 1128 is arranged. The cathode 1106 includes a first cathode plate array 1130 and a second cathode plate array 1132. In the first cathode plate array 1130 and the second cathode plate 1132, a cathode plate 1134 is arranged. The transformer 1112 has a primary winding 1136 and a secondary winding 1138.

A positive output terminal 1142 of the secondary winding 1138 and a feeding terminal 1140 of the anode bar 1128 are electrically connected to each other through the anode side feeding path 1108. A negative output terminal 1146 of the secondary winding 1138 and a feeding terminal 1144 of the cathode plate 1134 are electrically connected to each other through the cathode side feeding path 1110. A positive input terminal 1148 of the primary winding 1136 is electrically connected to the positive electrode connecting terminal 1116. A negative input terminal 1150 of the primary winding 1136 is electrically connected to the negative electrode connecting terminal 1118. When a pulse voltage is applied between the positive electrode connecting terminal 1116 and the negative electrode connecting terminal 1118, the pulse voltage is raised by the transformer 1112 and the pulse voltage thus raised is applied between the anode 1104 and the cathode 1106. When the raised pulse voltage is applied between the anode 1104 and the cathode 1106, a discharge is generated between the anode 1104 and the cathode 1106 in the passage 1008 and a plasma is generated in the passage 1008 so that a gas flowing in the passage 1008 is activated.

The passage formation 1100, the transformer chamber formation 1102, the anode 1104, the cathode 1106, the anode side feeding path 1108, the cathode side feeding path 1110, the transformer 1112 and the transformer holding member 1114 are housed in a housing space 1152 formed in the housing 1124. An internal surface 1154 of the housing 1124 is provided in contact with the housing space 1152 and defines the housing space 1152.

The transformer 1112, the anode bar 1128 and the cathode plate 1134 are disposed in such a manner that a distance D1 from the feeding terminal 1140 of the anode bar 1128 to the positive output terminal 1142 of the secondary winding 1138 is shorter than a distance D2 from the feeding terminal 1144 of the cathode plate 1134 to the negative output terminal 1146 of the secondary winding 1138. Moreover, a path length L1 of the anode side feeding path 1108 is set to be shorter than a path length L2 of the cathode side feeding path 1110. Furthermore, the cathode side feeding path 1110 is electrically connected to the housing 1124 and is desirably grounded. Consequently, the cathode side feeding path 1110 which is relatively long and the housing 1124 have an equal electric potential and the influence of a stray capacitance is decreased so that disturbances in a waveform of a pulse voltage to be applied between the anode 1104 and the cathode 1106 are suppressed.

The distance D1 is defined as the shortest direct distance from a surface of the feeding terminal 1140 of the anode bar 1128 to a surface of the positive output terminal 1142 of the secondary winding 1138. In the case in which at least two anode bars 1128 are present, an average of the shortest direct distances for each of at least two anode bars 1128 is regarded to be the distance D1.

The distance D2 is defined as the shortest direct distance from a surface of the feeding terminal 1144 of the cathode plate 1134 to a surface of the negative output terminal 1146 of the secondary winding 1138. In the case in which at least two cathode plates 1134 are present, an average of the shortest direct distances for each of at least two cathode plates 1134 is regarded to be the distance D2.

The path length L1 is the shortest length which is required for reaching to the surface of the positive output terminal 1142 of the secondary winding 1138 from the surface of the feeding terminal 1140 of the anode bar 1128 via an internal part of the anode side feeding path 1108. In the case in which at least two anode bars 1128 are present, an average value of the shortest length for each of at least two anode bars 1128 is regarded to be the path length L1.

The path length L2 is the shortest length which is required for reaching to the surface of the negative output terminal 1146 of the secondary winding 1138 from the surface of the feeding terminal 1144 of the cathode plate 1134 via an internal part of the cathode side feeding path 1110. In the case in which at least two cathode plates 1134 are present, an average value of the shortest length for each of at least two cathode plates 1134 is regarded to be the path length L2.

In place of the cathode side feeding path 1110, the anode side feeding path 1108 may be electrically connected to the housing 1124. In this case, the transformer 1112, the anode bar 1128 and the cathode plate 1134 are disposed in such a manner that the distance D2 is shorter than the distance D1. Moreover, the path length L2 is set to be shorter than the path length L1.

The anode bar 1128 and the cathode plate 1134 are disposed in such a manner that a distance D3 from the internal surface 1154 of the housing 1124 to the feeding terminal 1140 of the anode bar 1128 is longer than a distance D4 from the internal surface 1154 of the housing 1124 to the feeding terminal 1144 of the cathode plate 1134. Consequently, a stray capacitance between the anode side feeding path 1108 and the housing 1124 is decreased so that disturbances in the waveform of the pulse voltage to be applied between the anode 1104 and the cathode 1106 are suppressed.

The distance D3 is the shortest direct distance from the internal surface 1154 of the housing 1124 to the surface of the feeding terminal 1140 of the anode bar 1128. In the case in which at least two anode bars 1128 are present, an average value of the shortest direct distances for each of at least two anode bars 1128 is regarded to be the distance D3.

The distance D4 is the shortest direct distance from the internal surface 1154 of the housing 1124 to the surface of the feeding terminal 1144 of the cathode plate 1134. In the case in which at least two cathode plates 1134 are present, an average value of the shortest direct distances for each of at least two cathode plates 1134 is regarded to be the distance D4.

In the case in which the anode side feeding path 1108 is electrically connected to the housing 1124 in place of the cathode side feeding path 1110, the anode bar 1128 and the cathode plate 1134 are disposed in such a manner that the distance D4 is longer than the distance D3.

(Structure of Anode Bar Array)

In the anode bar array 1126, at least two anode bars 1128 are arranged. Consequently, a region in which a plasma is generated is extended so that a gas is efficiently reformed. The number of the anode bars 1128 which are arranged is increased/decreased as necessary. The anode bar array 1126 may be replaced with the single anode bar 1128.

At least two anode bars 1128 are arranged sparsely. The "sparse" arrangement of the anode bars 1128 indicates that at least two anode bars 1128 do not come in contact with each other but a gap is present between the first anode bar 1128 and the second anode bar 1128 which is adjacent to the first anode bar 1128. Consequently, the gas passes through the gap and flows close to the region in which the plasma is generated, and the gas is thus activated efficiently.

It is desirable that at least two anode bars 1128 should be arranged in parallel at an equal interval. Consequently, the gap is uniformly distributed over the section of the passage 1008 so that the gas flows evenly in the passage 1008 and the discharge is generated uniformly. These contribute to the efficient activation of the gas.

(Arrangement of Anode Bar)

The anode bar 1128 crosses the passage 1008. The "crossing" of the passage 1008 indicates an entrance into a second position of the internal surface of the passage 1008 via the passage 1008 out of a first position of the internal surface of the passage 1008. Consequently, both terminals of the anode bar 1128 which tend to be damaged are positioned on the outside of the passage 1008 and are not opposed to the cathode 1106 so that they do not function as a starting point or an ending point of a discharge. This contributes to a suppression in the damage of the anode bar 1128. Moreover, the feeding terminal 1140 of the anode bar 1128 is positioned on the outside of the passage 1008 so that the supply of a power to the anode bar 1128 can easily be carried out.

(Structure of Anode Bar)

The anode bar 1128 includes an electric conductor bar 1156 and an insulator film 1158. A surface of the electric conductor bar 1156 is covered with the insulator film 1158 in a portion other than the vicinity of one of terminals of the anode bar 1128. In the vicinity of one of the terminals of the anode bar 1128, the surface of the electric conductor bar 1156 is not covered with the insulator film 1158 but is exposed. A portion of the anode bar 1128 where the surface of the electric conductor bar 1156 is exposed serves as the feeding terminal 1140 of the anode bar 1128. Consequently, the surface of the electric conductor bar 1156 is not exposed at all or is rarely exposed in the passage 1008 so that an arch discharge is suppressed and a gas is activated efficiently.

(Connection of Anode and Positive Output Terminal of Secondary Winding)

The anode side feeding path 1108 includes an anode collector 1160 and an anode wiring 1162. The anode side feeding path 1108 may include a constituent other than the anode collector 1160 and the anode wiring 1162. The anode collector 1160 and the anode wiring 1162 may be an integral member and both or either of the anode collector 1160 and the anode wiring 1162 may be a multi-body member.

The feeding terminal 1140 of the anode bar 1128 is coupled to the anode collector 1160. Consequently, the anode bar 1128 and the anode collector 1160 are electrically connected to each other. The anode collector 1160 takes a planar shape. An anode bar coupling hole 1166 is formed on an anode bar coupling surface 1164 of the anode collector 1160. A shape of the anode bar coupling hole 1166 is adapted to a shape of the feeding terminal 1140 of the anode bar 1128. The anode bar coupling surface 1164 of the anode collector 1160 is perpendicular to the extending direction of the anode bar 1128. The feeding terminal 1140 of the anode bar 1128 is inserted into the anode bar coupling hole 1166 of the anode collector 1160.

One of terminals of the anode wiring 1162 is coupled to the anode collector 1160, and the other terminal of the anode wiring 1162 is coupled to the positive output terminal 1142 of the secondary wiring 1138. Consequently, the anode wiring 1162 and the anode collector 1160 are electrically connected to each other and the anode wiring 1162 and the positive output terminal 1142 of the secondary wiring 1138 are electrically connected to each other.

(Structure of Cathode Plate Array)

In each of the first cathode plate array 1130 and the second cathode plate array 1132, at least two cathode plates 1134 are arranged. Consequently, the region in which the plasma is generated is extended so that the gas is reformed efficiently. The number of the cathode plates 1134 which are arranged is increased/decreased as necessary. Both or either of the first cathode plate array 1130 and the second cathode plate array 1132 may be replaced with the single cathode plate 1134.

At least two cathode plates 1134 are arranged sparsely. The "sparse" arrangement of the cathode plates 1134 indicates that at least two cathode plates 1134 do not come in contact with each other but a gap is present between the first cathode plate 1134 and the second cathode plate 1134 which is adjacent to the first cathode plate 1134. Consequently, the gas passes through the gap and flows close to the region in which the plasma is generated, and the gas is thus activated efficiently.

It is desirable that at least two cathode plates 1134 should be arranged in parallel at an equal interval. Consequently, the gap is uniformly distributed over the section of the passage 1008 so that the gas flows evenly in the passage 1008 and the discharge is generated uniformly. These contribute to the efficient activation of the gas.

A main surface of the cathode plate 1134 is parallel with the extending direction of the passage 1008. Consequently, the flow of gas can be prevented from being disturbed by the cathode plate 1134 so that the gas uniformly flows in the passage 1008 and a discharge is generated evenly. The extending direction of the passage 1008 is a direction from the inlet 1010 toward the outlet 1012 in which the gas flows.

(Arrangement of Cathode Plate)

The cathode plate 1134 crosses the passage 1008. Consequently, both terminals of the cathode plate 1134 which tend to be damaged are positioned on the outside of the passage 1008 and are not opposed to the anode 1104 so that they do not function as a starting point or an ending point of a discharge. This contributes to a suppression in the damage of the cathode plate 1134. Moreover, the feeding terminal 1144 of the cathode plate 1134 is positioned on the outside of the passage 1008 so that the supply of a power to the cathode plate 1134 can easily be carried out.

(Structure of Cathode Plate)

The cathode plate 1134 includes an electric conductor plate 1168 and an insulator film 1170. A surface of the electric conductor plate 1168 is covered with the insulator film 1170 in a portion other than the vicinity of one of terminals of the cathode plate 1134. In the vicinity of one of the terminals of the cathode plate 1134, the surface of the electric conductor plate 1168 is not covered with the insulator film 1170 but is exposed. A portion of the cathode plate 1134 where the surface of the electric conductor plate 1168 is exposed serves as the feeding terminal 1144 of the cathode plate 1134. Consequently, the surface of the electric conductor plate 1168 is not exposed at all or is rarely exposed in the passage 1008 so that an arch discharge is suppressed and a gas is activated efficiently.

The cathode plate 1134 is a slender member taking a slender planar shape in which a long side is remarkably greater than a short side. An extending direction of the long side of the cathode plate 1134 is equivalent to an extending direction of the cathode plate 1134. The short side of the electric conductor plate 1168 may be extended or shortened and may have a length which is almost equal to a thickness of the electric conductor plate 1168. In other words, the cathode plate 1134 may take a shape which does not belong to the category of a plate.

(Connection of Cathode and Negative Output Terminal of Secondary Winding)

The cathode side feeding path 1110 includes a cathode collector 1172 and a cathode wiring 1174. The cathode side feeding path 1110 may include a constituent other than the cathode collector 1172 and the cathode wiring 1174. The cathode collector 1172 and the cathode wiring 1174 may be an integral member and both or either of the anode collector 1172 and the cathode wiring 1174 may be a multi-body member.

The feeding terminal 1144 of the cathode plate 1134 is coupled to the cathode collector 1172. Consequently, the cathode plate 1134 and the cathode collector 1172 are electrically connected to each other. The cathode collector 1172 takes a planar shape. A cathode bar coupling hole 1179 is formed on a cathode plate coupling surface 1177 of the cathode collector 1172. A shape of the cathode plate coupling hole 1179 of the cathode collector 1172 is adapted to a shape of the feeding terminal 1144 of the cathode plate 1134. The cathode plate coupling surface 1177 of the cathode collector 1172 is perpendicular to the extending direction of the cathode plate 1134. The feeding terminal 1144 of the cathode plate 1134 is inserted into the cathode plate coupling hole 1179 of the cathode collector 1172.

One of terminals of the cathode wiring 1174 is coupled to the cathode collector 1172, and the other terminal of the cathode wiring 1174 is coupled to the negative output terminal 1146 of the secondary wiring 1138. Consequently, the cathode wiring 1174 and the cathode collector 1172 are electrically connected to each other and the cathode wiring 1174 and the negative output terminal 1146 of the secondary wiring 1138 of the transformer 1112 are electrically connected to each other.

A wiring length of the cathode wiring 1174 is set to be longer than a wiring length of the anode wiring 1162. In the case in which the anode side feeding path 1108 is electrically connected to the housing 1124 in place of the cathode side feeding path 1110, the wiring length of the anode wiring 1162 is set to be longer than the wiring length of the cathode wiring 1174.

The wiring length of the anode wiring 1162 is the shortest distance required for reaching to a coupling position to the positive output terminal 1142 of the secondary wiring 1138 from a coupling position to the anode collector 1160 via the inner part of the anode wiring 1162.

The wiring length of the cathode wiring 1174 is the shortest distance required for reaching to a coupling position to the negative output terminal 1146 of the secondary wiring 1138 from a coupling position to the cathode collector 1172 via the inner part of the cathode wiring 1174.

(Position of Anode Bar Array, First Cathode Plate Array and Second Cathode Plate Array)

The first cathode plate array 1130 and the second cathode plate array 1132 are separated from the anode bar array 1126 in the extending direction of the passage 1008. The first cathode plate array 1130 is provided closer to the inlet 1010 than the anode bar array 1126. The second cathode plate array 1132 is provided closer to the outlet 1012 than the anode bar array 1126. Accordingly, the passage section 1176 that the cathode plate 1134 of the first cathode plate array 1130 crosses and the passage section 1178 that the cathode plate 1134 of the second cathode plate array 1132 crosses are separated from the passage section 1180 that the anode bar 1128 crosses in the extending direction of the passage 1008.

The gas flowing in the passage 1008 sequentially passes through the gap of the first cathode plate array 1130, the gap of the anode bar array 1126 and the gap of the second cathode plate array 1132. Consequently, the gas flowing in the passage 1008 is activated by a plasma generated in a section from the first cathode plate array 1130 to the anode bar array 1126 and is furthermore activated by a plasma generated in a section from the anode bar array 1126 to the second cathode plate array 1132.

It is desirable that each of the passage sections 1176, 1178 and 1180 should be perpendicular to the extending direction of the passage 1008. Moreover, the passage sections 1176, 1178 and 1180 are parallel with each other. Consequently, a discharge is generated uniformly so that the gas is activated evenly.

(Increase/Decrease of Anode Bar Array and Cathode Plate Array)

Either of the first cathode plate array 1130 and the second cathode plate array 1132 may be omitted. It is also possible to add a cathode plate array other than the first cathode plate array 1130 and the second cathode plate array 1132. It is also possible to add an anode bar array other than the anode bar array 1126.

(Relationship Between Extending Direction of Anode Bar and Extending Direction of Cathode Plate)

The extending direction of the anode bar 1128 and the extending direction of the cathode plate 1134 are nonparallel with each other and are desirably orthogonal to each other. Consequently, the anode bar 1128 and the cathode plate 1134 cross each other as seen in an axial direction of the passage 1008, and a discharge tends to be generated on a crossing point of the anode bar 1128 and the cathode plate 1134 as seen in the axial direction of the passage 1008 so that the gas is activated efficiently.

In the case in which the extending direction of the anode bar 1128 is nonparallel with the extending direction of the cathode plate 1134, the position of the feeding terminal 1140 of the anode bar 1128 and the position of the feeding terminal 1144 of the cathode plate 1134 are shifted in a circumferential direction of the passage 1008. Accordingly, the distances D1 and D2 depend on the extending direction of the anode bar 1128 and the extending direction of the cathode plate 1134.

In the reactor 1002, the extending directions of the anode bar 1128 and the cathode plate 1134 are selected in such a manner that the distance D1 is shorter than the distance D2. In consideration of a first direction which is parallel with the passage sections 1176, 1178 and 1180 and extends from a central axis of the passage 1008 toward the positive output terminal 1142 of the secondary winding 1138 and a second direction which is perpendicular to the first direction, the extending direction of the anode bar 1128 is closer to the first direction than the second direction and the extending direction of the cathode plate 1134 is closer to the second direction than the first direction.

It is desirable that the anode bar 1128 and the cathode plate 1134 are extended rectilinearly.

(Electrical Connection of Cathode and Housing)

The cathode collector 1172 and the housing 1124 are electrically connected to each other through a connecting member 1188 formed by an electric conductor. In place of the cathode collector 1172, the cathode wiring 1174 and the housing 1124 may be connected electrically to each other. The connecting member 1188 may be omitted and the cathode collector 1172 or the cathode wiring 1174 and the housing 1124 may directly come in contact with each other.

(Structure of Passage Formation and Transformer Chamber Formation)

The passage formation 1100 is a structure in which the passage 1008 is formed. The passage 1008 takes a circular sectional shape. However, the passage 1008 may take a sectional shape other than the circular shape. It is desirable that the passage 1008 should be extended rectilinearly. A housing trench 1182 for the anode collector 1160 and a housing trench 1184 for the cathode collector 1172 are formed on an external surface of the passage formation 1100. The anode collector 1160 is housed in the housing trench 1182 for the anode collector 1160 and is fixed to the external surface of the passage formation 1100. The cathode collector 1172 is housed in the housing trench 1184 for the cathode collector 1172 and is fixed to the external surface of the passage formation 1100. The anode collector 1160 and the cathode collector 1172 may be fixed to the external surface of the passage formation 1100 by other means. For example, the anode collector 1160 and the cathode collector 1172 may be bonded to the external surface of the passage formation 1100.

A transformer chamber 1183 is formed in the transformer chamber formation 1102. The transformer 1112 is housed in the transformer chamber 1183. The transformer 1112 is held in the transformer chamber 1183 through the transformer holding member 1114. The transformer chamber formation 1102 may be omitted and the transformer 1112 may be held on the internal surface 1154 of the housing 1124 or a holding mechanism such as a frame.

The passage formation 1100, the anode 1104, the cathode 1106, the anode collector 1160 and the cathode collector 1172 are embedded in the transformer chamber formation 1102. The transformer chamber formation 1102 is housed in the housing space 1152 of the housing 1124. However, the passage formation 1100, the anode 1104, the cathode 1106, the anode collector 1160 and the cathode collector 1172 do not need to be embedded in the transformer chamber formation 1102.

Although most of the anode wiring 1162 is embedded in the transformer chamber formation 1102, one of the terminals of the anode wiring 1162 protrudes out of the transformer chamber formation 1102 in the vicinity of the secondary wiring 1138. Consequently, it is easy to couple one of the terminals of the anode wiring 1162 and the positive output terminal 1142 of the secondary wiring 1138.

Although most of the cathode wiring 1174 is embedded in the transformer chamber formation 1102, one of the terminals of the cathode wiring 1174 protrudes out of the transformer chamber formation 1102 in the vicinity of the secondary wiring 1138. Consequently, it is easy to couple one of the terminals of the cathode wiring 1174 and the negative output terminal 1146 of the secondary wiring 1138.

(Material of Constituents)

The electric conductor bar 1156, the electric conductor plate 1168, the anode collector 1160, the anode wiring 1162, the cathode collector 1172, the cathode wiring 1174 and the housing 1124 are formed of stainless steel. However, these constituents are also permitted to be formed by an electric conductor other than the stainless steel. For example, these constituents are also permitted to be formed of a metal such as copper, aluminum or nickel or an alloy containing these metals as a main component, for example.

The passage formation 1100, the transformer chamber formation 1102 and the transformer holding member 1114 are formed of a polyetheretherketone (PEEK) resin. However, these constituents are permitted to be constituted by an insulator other than the polyetheretherketone resin. For example, these constituents are also permitted to be constituted by an epoxy resin.

The insulator film 1158 and the insulator film 1170 are formed of alumina ceramics. However, the insulator film 1158 and the insulator film 1170 are permitted to be formed by an insulator other than the alumina ceramics. For example, the insulator film 1158 and the insulator film 1170 are also permitted to be constituted by zirconia ceramics, a fluorocarbon resin or the like.

(Electrical System of Plasma Treatment Apparatus)

Figure 5:
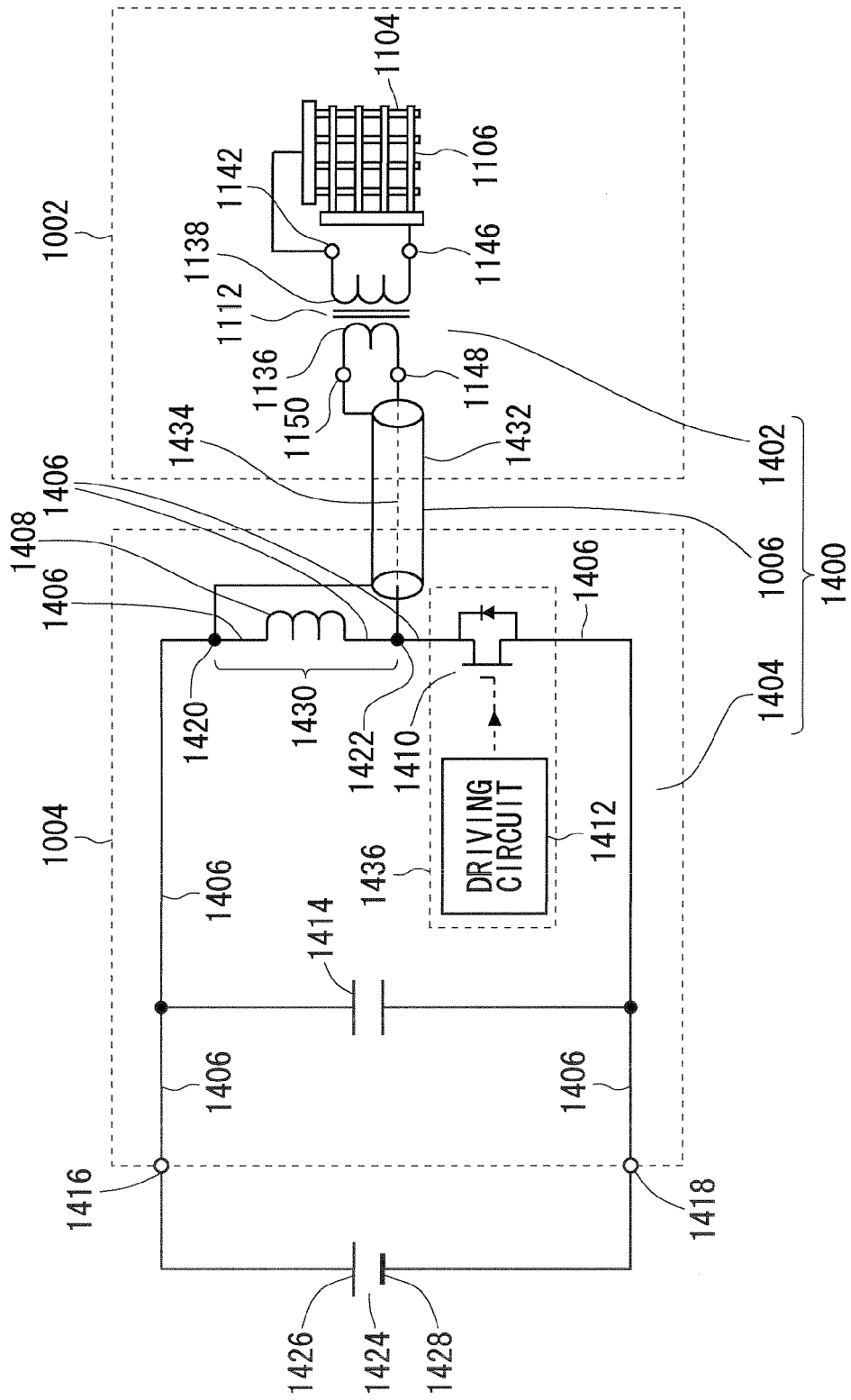
FIG. 5 is a circuit diagram showing an electric system of the plasma treatment apparatus.

A circuit diagram of FIG. 5 shows an electrical system of the plasma treatment apparatus.

As shown in FIG. 5, an electrical system 1400 of the plasma treatment apparatus 1000 is provided across the reactor 1002 and the pulse generator body 1004. An internal circuit 1402 of het reactor 1002 and an internal circuit 1404 of the pulse generator body 1004 are connected to each other through the coaxial cable 1006. The whole electrical system 1400 of the plasma treatment apparatus 1000 may be provided in the reactor 1002.

The internal circuit 1404 of the pulse generator body 1004 includes a conduction path 1406, an inductor 1408, a metal oxide semiconductor field effect transistor (MOSFET) 1410, a driving circuit 1412 and a capacitor 1414.

The conduction path 1406 reaches from a first DC input terminal 1416 to a second DC input terminal 1418 sequentially via a first branch 1420 and a second branch 1422. A positive pole 1426 of a battery 1424 is connected to the first DC input terminal 1416. A negative pole 1428 of the battery 1424 is connected to the second DC input terminal 1418. It is sufficient that a DC voltage is applied between the first DC input terminal 1416 and the second DC input terminal 1418. Accordingly, the battery 1424 may be replaced with other types of DC sources.

The inductor 1408 is inserted into a section 1430 from the first branch 1420 to the second branch 1422 of the conduction path 1406, and the MOSFET 1410 is inserted in a section other than the section 1430 of the conduction path 1406. One of the terminals of the inductor 1408 is electrically connected to the first DC input terminal 1416, the other terminal of the inductor 1408 is electrically connected to a drain of the MOSFET 1410, and a source of the MOSFET 1410 is electrically connected to the second DC input terminal 1418. A driving signal is input from the driving circuit 1412 to a gate of the MOSFET 1410. One of the terminals of the capacitor 1414 is electrically connected to the first DC input terminal 1416, and the other terminal of the capacitor 1414 is electrically connected to the second DC input terminal 1418.

The MOSFET 1410 may be inserted in a section from the first DC input terminal 1416 to the first branch 1420 of the conduction path 1406.

The first branch 1420 of the conduction path 1406 and the negative input terminal 1150 of the primary winding 1136 are electrically connected to each other through an external conductor 1432 of the coaxial cable 1006. The second branch 1422 of the conduction path 1406 and the positive input terminal 1148 of the primary winding 1136 are electrically connected to each other through an internal conductor 1434 of the coaxial cable 1006. The coaxial cable 1006 may be replaced with another transmission line such as a twist pair cable or a parallel feeder. In more general, the first branch 1420 of the conduction path 1406 and the negative input terminal 1150 of the primary winding 1136 are electrically connected to each other through a first transmission wire of the transmission line. The second branch 1422 of the conduction path 1406 and the positive input terminal 1148 of the primary winding 1136 are electrically connected to each other through a second transmission wire of the transmission line.

The MOSFET 1410 and the driving circuit 1412 constitute a switch circuit 1436 for opening/closing the conduction path 1406. The MOSFET 1410 may be replaced with other types of switching elements, for example, an insulated gate bipolar transistor (IGBT), a static induction thyristor (SI thyristor), a bipolar transistor and the like, and the switch circuit may be replaced with other types of switch circuits. In the case in which the switch circuit is replaced, a circuit for applying a bias is added as necessary.

The electrical system 1400 of the plasma treatment apparatus 1000 functions as a pulse generating circuit of an induction energy storage type. When the conduction path 1406 is closed by the switch circuit 1436, a current flows to the conduction path 1406 so that the induction energy is stored in the inductor 1408. When the conduction path 1406 is opened by the switch circuit 1436 in a state in which the induction energy is stored in the inductor 1408, an induced electromotive force is generated in the inductor 1408 and a pulse voltage generated by the induced electromotive force is transmitted through the coaxial cable 1006 so that the pulse voltage is applied between the positive input terminal 1148 and the negative input terminal 1150 of the primary winding 1136. When the conduction path 1406 is repetitively opened/closed by the switch circuit 1436, accordingly, a string of the pulse voltage is applied between the positive input terminal 1148 and the negative input terminal 1150 of the primary wining 1136. It is also possible to use a pulse generating circuit other than the pulse generating circuit of the induction energy storage type.

(Example of Use of Plasma Treatment Apparatus)

Figure 6:
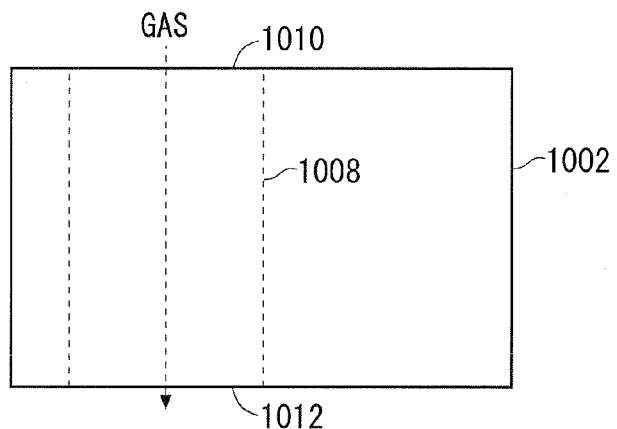
FIG. 6 is a schematic diagram showing an example of use of the plasma treatment apparatus.
Figure 7:
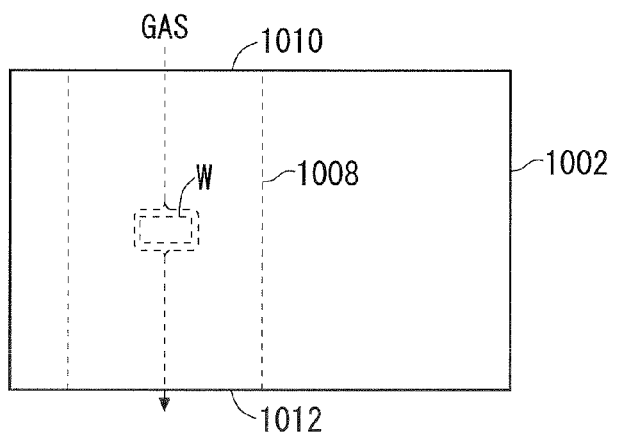
FIG. 7 is a schematic diagram showing an example of the use of the plasma treatment apparatus.
Figure 8:
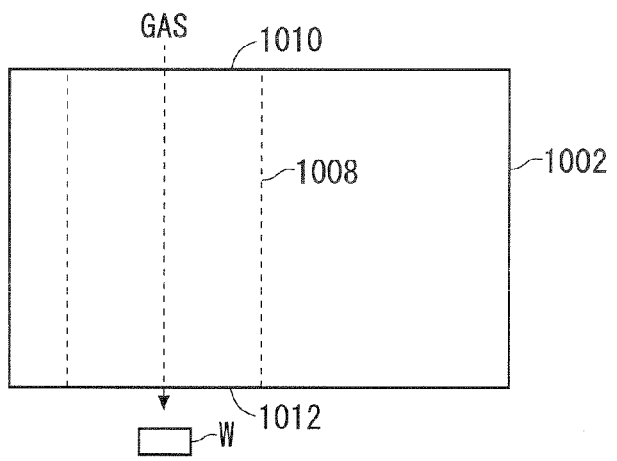
FIG. 8 is a schematic diagram showing an example of the use of the plasma treatment apparatus.

Schematic diagrams of FIGS. 6 to 8 show an example of use of the plasma treatment apparatus.

In the case in which the plasma treatment apparatus 1000 is used for activating a gas, the gas is caused to flow to the passage 1008 to generate a plasma in the passage 1008 as shown in FIG. 6. The gas activated in the passage 1008 is fed from the reactor 1002 to a supply destination. The supply destination includes an incinerator, a firing furnace and the like. In the case in which the activated gas is supplied to the incinerator, it contributes to an enhancement in a combustion efficiency or the like. In the case in which the activated gas is supplied to the firing furnace, it contributes a promotion of a heat treatment or the like. Although the gas to be an activating target is not particularly restricted, it is nitrogen ($N_2$), water ($H_2O$), hydrogen peroxide ($H_2O_2$), tetrafluoromethane ($CF_4$), trifluoromethane ($CHF_3$) or the like, for example.

In the case in which the plasma treatment apparatus 1000 is used to treat a surface of a target constituted by a solid, a target W is housed in the passage 1008 and the gas is caused to flow in the passage 1008 so that the plasma is generated in the passage 1008 as shown in FIG. 7. Consequently, the plasma acts on a surface of the target W and the surface of the target W is thus treated. The treatment of the surface includes a treatment (reforming) for enhancing a wettability of a surface, a treatment (sterilization or pasteurization) for killing a microorganism sticking to a surface, and the like.

Even in the case in which the plasma treatment apparatus 1000 is used to treat the surface of the target constituted by the solid, it is not essential that the target W is housed in the passage 1008. As shown in FIG. 8, accordingly, the activated gas may be sprayed onto the target W provided on the outside of the passage 1008.

While the invention has been shown and described in detail, the foregoing description is in all aspects illustrative and not restrictive. It is therefore understood that numerous modifications and variations can be devised without departing from the scope of the invention.

EXPLANATION OF DESIGNATION 1000 plasma treatment apparatus
1002 reactor
1004 pulse generator body
1006 coaxial cable
1008 passage
1100 passage formation 1108 anode side feeding path
1110 cathode side feeding path
1112 transformer
1128 anode bar
1134 cathode plate
1138 secondary winding
1140 feeding terminal
1142 positive output terminal
1144 feeding terminal
1146 negative output terminal

The invention claimed is:

1. A reactor structure of a plasma treatment apparatus comprising:
a structure in which a passage is formed;
a transformer including a primary winding and a secondary winding having a first output terminal and a second output terminal;
a first electrode having a first feeding terminal provided apart from said first output terminal by a first distance, extending in a first direction, and crossing said passage;
a second electrode having a second feeding terminal provided apart from said second output terminal by a second distance which is longer than said first distance, extending in a second direction which is nonparallel with said first direction, provided apart from said first electrode in an extending direction of said passage, and crossing said passage;
a first feeding path which electrically connects said first output terminal to said first feeding terminal and has a first path length;
a second feeding path which electrically connects said second output terminal to said second feeding terminal and has a second path length that is longer than said first path length; and
a housing which is provided with a housing space for housing said structure, said transformer, said first electrode, said second electrode, said first feeding path and said second feeding path, is formed by an electric conductor, and is connected electrically to said second feeding path, wherein
said housing as an internal surface provided in contact with said housing space,
said first feeding terminal is provided apart from said internal surface by a third distance,
said second feeding terminal is provided apart from said internal surface by a fourth distance which is shorter than said third distance,
at least two first electrodes are arranged in parallel,
at least two second electrodes are arranged in parallel,
said first feeding path includes
a first collector having a first coupling surface to which said first electrode is coupled, and
a first wiring coupled to said first output terminal and said first collector and having a first wiring length, and
said second feeding path includes
a second collector having a second coupling surface to which said second electrode is coupled, and
a second wiring coupled to said second output terminal and said second collect and having a second wiring length which is greater than said first wiring length.

2. A plasma treatment apparatus comprising:
a structure in which a passage is formed;
a transformer including a primary winding having a first input terminal and a second input terminal, and a secondary winding having a first output terminal and a second output terminal;
a first electrode having a first feeding terminal provided apart from said first output terminal by a first distance, extending in a first direction, and crossing said passage;
a second electrode having a second feeding terminal provided apart from said second output terminal by a second distance which is longer than said first distance, extending in a second direction which is nonparallel with said first direction, provided apart from said first electrode in an extending direction of said passage, and crossing said passage;
a first feeding path which electrically connects said first output terminal to said first feeding terminal and has a first path length;
a second feeding path which electrically connects said second output terminal to said second feeding terminal and has a second path length that is longer than said first path length;
a housing which is provided with a housing space for housing said structure, said transformer, said first electrode, said second electrode, said first feeding path and said second feeding path, is formed by an electric conductor, and is connected electrically to said second feeding path;
a conduction path reaching from a first DC input terminal to a second DC input terminal sequentially via a first branch and a second branch;
an inductor inserted in a section from said first branch to said second branch of said conduction path;
a switch circuit inserted into a section other than said section of said conduction path for electrically opening/closing said conduction path; and
a transmission line including a first transmission wire for electrically connecting said first branch and said first input terminal and a second transmission wire for electrically connecting said second branch and a second input terminal.

* * * * *